(12) United States Patent
Wu et al.

(10) Patent No.: US 11,533,048 B1
(45) Date of Patent: Dec. 20, 2022

(54) DELAY CIRCUIT

(71) Applicant: CHANGXIN MEMORY TECHNOLOGIES, INC., Hefei (CN)

(72) Inventors: Daoxun Wu, Hefei (CN); Weibing Shang, Hefei (CN); Yanfeng Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/657,609

(22) Filed: Mar. 31, 2022

(30) Foreign Application Priority Data

Jan. 11, 2022 (CN) .......................... 202210028011.5

(51) Int. Cl.
 *H03K 5/13* (2014.01)
 *H03K 5/133* (2014.01)
 *H03K 5/00* (2006.01)

(52) U.S. Cl.
 CPC ..... *H03K 5/133* (2013.01); *H03K 2005/0013* (2013.01); *H03K 2005/00195* (2013.01)

(58) Field of Classification Search
 CPC ........... H03K 5/133; H03K 2005/0013; H03K 2005/00195
 USPC ........................................................ 327/261
 See application file for complete search history.

(56) References Cited

U.S. PATENT DOCUMENTS

| | | | | |
|---|---|---|---|---|
| 5,051,630 A * | 9/1991 | Kogan | ................ | H03K 5/133 327/264 |
| 5,081,380 A * | 1/1992 | Chen | ................ | H03K 5/133 327/237 |
| 6,002,286 A * | 12/1999 | Cline | ................ | G11C 7/22 327/284 |
| 6,046,619 A * | 4/2000 | Pascucci | ................ | H03K 5/04 327/264 |
| 6,242,954 B1 * | 6/2001 | Taniguchi | ............. | H03L 7/0818 327/158 |
| 6,452,430 B1 * | 9/2002 | Tung | ................ | H03L 7/0995 327/158 |
| 6,598,212 B2 * | 7/2003 | Okayasu | ................ | H03K 5/133 716/136 |
| 7,109,775 B2 * | 9/2006 | Tomita | ................ | H03K 5/133 327/276 |
| 7,352,223 B2 * | 4/2008 | Tomita | ................ | H03K 5/133 327/280 |

(Continued)

FOREIGN PATENT DOCUMENTS

CN 114204919 A 3/2022

*Primary Examiner* — Ryan Jager
(74) *Attorney, Agent, or Firm* — Syncoda LLC; Feng Ma

(57) ABSTRACT

A delay circuit includes the following: an input module, configured to receive a target input signal and output the target input signal to a first node, the target input signal being a rising edge signal or a falling edge signal of a pulse signal; an output module, configured to output a target output signal, the target output signal being a delayed signal of the target input signal; and a delay control module, connected to the input module through the first node, and connected to the output module through a second node. The delay control module includes at least one delay capacitor unit, and the delay control module is configured to control a connection between the at least one delay capacitor unit and the first node according to a rising edge delay duration or a falling edge delay duration.

20 Claims, 18 Drawing Sheets

(56) References Cited

U.S. PATENT DOCUMENTS

| | | | | |
|---|---|---|---|---|
| 7,525,364 | B2* | 4/2009 | Ariyoshi | H03L 7/0805 |
| | | | | 327/155 |
| 8,278,986 | B2* | 10/2012 | Bettini | H03K 5/131 |
| | | | | 327/170 |
| 11,451,219 | B2* | 9/2022 | Shang | H03K 5/00 |
| 2002/0059536 | A1* | 5/2002 | Saeki | G06F 7/68 |
| | | | | 713/500 |
| 2003/0214339 | A1* | 11/2003 | Miyamoto | H03L 7/0814 |
| | | | | 327/276 |
| 2005/0184787 | A1* | 8/2005 | Tomita | G11C 29/02 |
| | | | | 327/277 |
| 2011/0156785 | A1* | 6/2011 | Bettini | H03L 7/0818 |
| | | | | 327/161 |
| 2013/0009796 | A1 | 1/2013 | Sakiyama | |
| 2013/0176062 | A1* | 7/2013 | Wang | H03K 5/133 |
| | | | | 327/161 |
| 2019/0190505 | A1* | 6/2019 | Yi | H03K 5/14 |
| 2022/0094344 | A1* | 3/2022 | Shang | H03K 5/13 |

\* cited by examiner

DELAY CIRCUIT

CROSS-REFERENCE TO RELATED APPLICATION

This application claims priority to Chinese Patent Application No. CN202210028011.5 filed on Jan. 11, 2022, the disclosure of which is hereby incorporated by reference in its entirety.

BACKGROUND

A delay circuit is used for delaying a rising edge and/or a falling edge of a pulse signal. In some implementations, a capacitor is generally arranged between an input terminal and an output terminal of the delay circuit, to extend a time for a rising edge signal or a falling edge signal to reach the output terminal.

In some designs, an inverter and a feedback circuit may be arranged between the input terminal and the output terminal, to clip an output waveform, improve a state restoration speed and avoid affecting processing of a next signal.

It should be noted that information disclosed in the background section is merely used for enhancing the understanding of the background of the disclosure, and it may include information that does not form prior art that is already known to a person of ordinary skill in the art.

SUMMARY

The disclosure relates to the technical field of electronic circuits, and in particular to a delay circuit with low power consumption.

The purpose of the disclosure is to provide a delay circuit, which can overcome the problem of high circuit power consumption when the delay circuit performs state restoration to a certain extent.

According to a first aspect of the disclosure, there is provided a delay circuit. The delay circuit includes: an input module, configured to receive a target input signal and output the target input signal to a first node, the target input signal being a rising edge signal or a falling edge signal of a pulse signal; an output module, configured to output a target output signal, the target output signal being a delayed signal of the target input signal; and a delay control module, connected to the input module through the first node, and connected to the output module through a second node. The delay control module includes at least one delay capacitor unit, and the delay control module is configured to control the at least one delay capacitor unit to connect to the first node within a rising edge delay duration or a falling edge delay duration, and control the at least one delay capacitor unit to disconnect from the first node outside the rising edge delay duration or the falling edge delay duration. The rising edge delay duration is a delay duration between a rising edge of the target output signal and a rising edge of the target input signal, and the falling edge delay duration is a delay duration between a falling edge of the target output signal and a falling edge of the target input signal.

It should be understood that the foregoing general description and the following detailed description are exemplary and explanatory only and are not intended to limit the disclosure.

BRIEF DESCRIPTION OF THE DRAWINGS

The accompanying drawings, which are incorporated in and constitute a part of the specification, illustrate embodiments of the disclosure and, together with the description, serve to explain the principle of the disclosure. It is apparent that the drawings are merely some embodiments of the present disclosure, a person having ordinary skill in this field can obtain other figures according to these figures without creative efforts.

DETAILED DESCRIPTION

Figure 1:
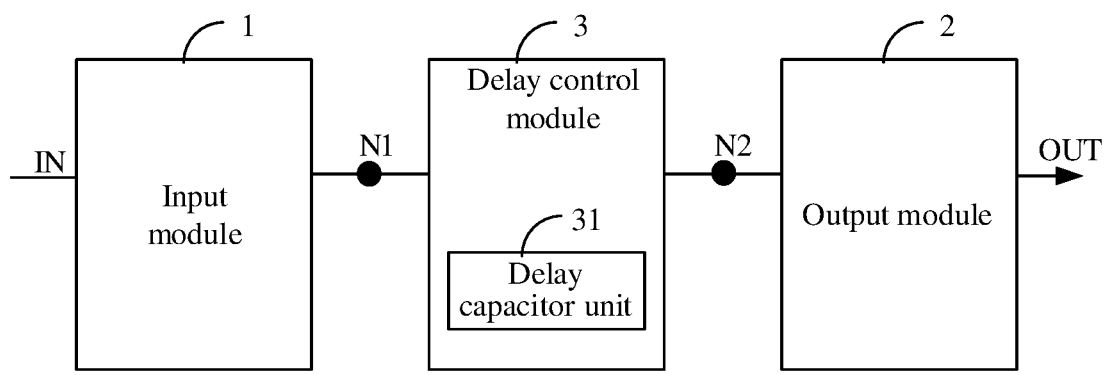
FIG. 1 is a schematic structural diagram of a delay circuit according to an exemplary embodiment of the disclosure.

Exemplary implementations will now be described more fully with reference to the accompanying drawings. However, the exemplary implementations may be implemented in various forms and should not be construed as being limited to the examples set forth herein. Rather, these implementations are provided so that the present disclosure will be more comprehensive and complete, and the idea of the exemplary implementations will be fully communicated to those skilled in the art. The described features, structures or characteristics may be combined in one or more implementations in any suitable manner. In the following description, many specific details are provided to give a thorough understanding of the implementations of the disclosure. However, those skilled in the art will appreciate that technical solution of the present disclosure may be practiced without one or more of specific details, or other methods, components, devices, steps and the like may be employed. In other instances, well-known technical solutions are not shown or described in detail to avoid obscuring aspects of the present disclosure.

In addition, the accompanying drawings are merely schematic illustrations of the present disclosure, and the same reference numerals in the drawings denote the same or similar parts, and thus their repeated descriptions will be omitted. Some of the block diagrams in the drawings are functional entities that do not necessarily correspond to physically or logically independent entities. The functional entities may be implemented in software, in one or more hardware modules or integrated circuits, or in different networks and/or processors and/or microcontrollers.

When a capacitor is arranged between an input terminal and an output terminal of the delay circuit to extend a time for a rising edge signal or a falling edge signal to reach the output terminal, such method may cause signal deformation, and the delay circuit may not return to an initial state in time, which may affect processing of a next signal. Therefore, such method is not suitable for designing a circuit such as a memory that requires low power consumption and high response speed.

In some designs, an inverter and a feedback circuit may be arranged between the input terminal and the output terminal, to clip an output waveform, improve a state restoration speed and avoid affecting the processing of the next signal. Such feedback circuit restores the state by resetting the capacitor in the delay circuit through charging and discharging, which, however, may lead to a higher overall power of the circuit. Therefore, it is necessary to reduce the overall power of the delay circuit while improving the state restoration speed.

Exemplary implementations of the present disclosure will be described in detail below with reference to the accompanying drawings.

FIG. 1 is a schematic structural diagram of a delay circuit according to an exemplary embodiment of the disclosure.

With reference to FIG. 1, a delay circuit 100 may include an input module 1, an output module 2 and a delay control module 3.

The input module 1 is configured to receive a target input signal IN and output the target input signal IN to a first node N1. The target input signal is a rising edge signal or a falling edge signal of a pulse signal.

The output module 2 is configured to output a target output signal OUT. The target output signal OUT is a delayed signal of the target input signal IN.

The delay control module 3 is connected to the input module 1 through the first node N1, and connected to the output module 2 through a second node N2. The delay control module 3 includes at least one delay capacitor unit 31, and the delay control module is configured to control the at least one delay capacitor unit 31 to connect to the first node N1 within a rising edge delay duration or a falling edge delay duration, and control the at least one delay capacitor unit 31 to disconnect from the first node N1 outside the rising edge delay duration or the falling edge delay duration. The rising edge delay duration is a delay duration between a rising edge of the target output signal and a rising edge of the target input signal, and the falling edge delay duration is a delay duration between a falling edge of the target output signal and a falling edge of the target input signal.

The target input signal may be delayed by the delay capacitor unit 31 for a preset duration by controlling the delay capacitor unit 31 to connect to the first node N1 before the output module 2 outputs the target output signal. Moreover, the delay capacitor unit 31 may be controlled to disconnect from the first node after the output module 2 outputs the target output signal, so as to preventing the delay capacitor unit 31 from continuing to affect the delay control module 3 after the target output signal is output, resulting in prolonging state restoration duration of the delay control module 3. Therefore, power loss caused by charging and discharging the delay capacitor unit 31 can be reduced, and the delay circuit 100 can operate with a low power.

In the delay circuit according to the embodiments of the disclosure, the delay capacitor unit is controlled to connect to the input terminal after the target input signal arrives and before the target output signal is output, and the delay capacitor unit is controlled to disconnect from the input terminal after the target output signal is output. The delay capacitor unit is disconnected once it completes a delay task, and an influence of the delay capacitor unit on the state restoration of the delay circuit can be avoided. Therefore, a feedback circuit can be omitted, the high power consumption caused by the feedback circuit can be avoided, and the overall power consumption of the delay circuit can be effectively reduced while improving the state restoration speed of the delay circuit.

Exemplary embodiments of the delay circuit illustrated in FIG. 1 are described below.

Figure 2A:
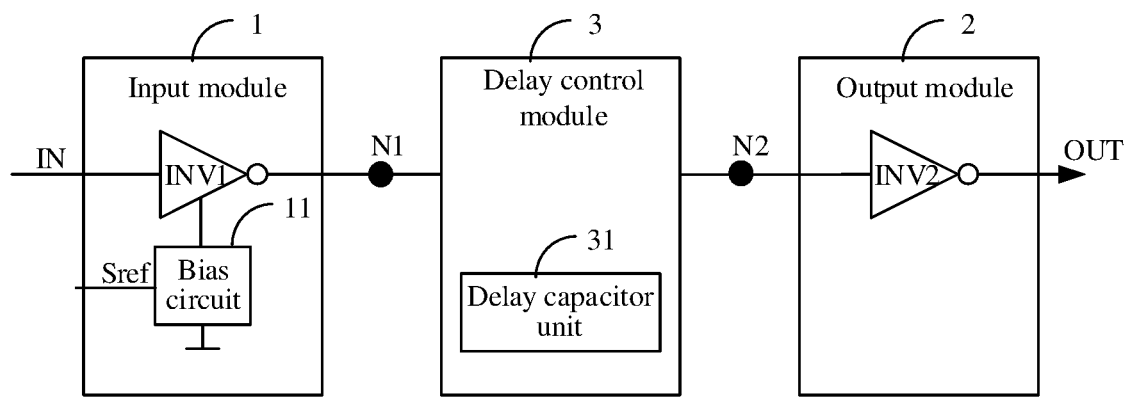
FIG. 2A is a circuit schematic diagram of an input module 1 and an output module 2 according to an embodiment of the disclosure.
Figure 2B:
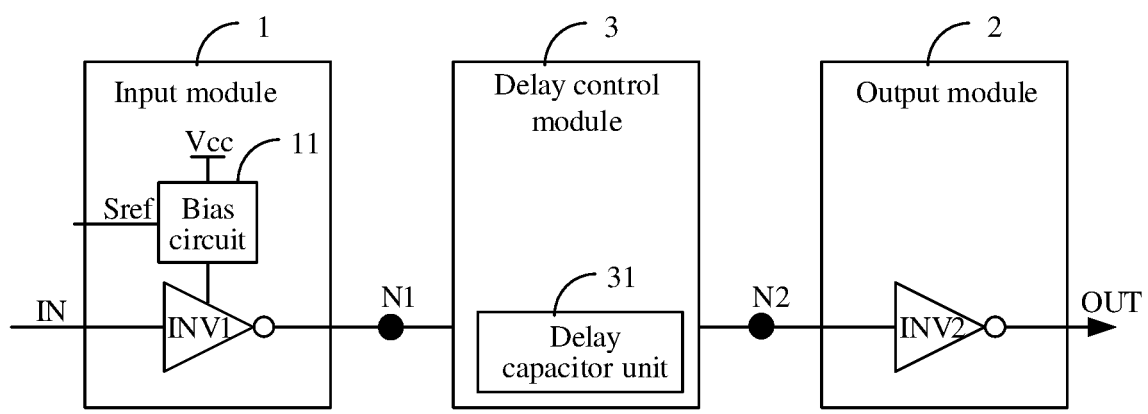
FIG. 2B is a circuit schematic diagram of an input module 1 and an output module 2 according to another embodiment of the disclosure.

FIG. 2A and FIG. 2B are circuit schematic diagrams of an input module 1 and an output module 2 according to two embodiments of the disclosure, respectively.

With reference to FIGS. 2A and 2B, in an exemplary embodiment of the disclosure, the input module 1 includes a first inverter INV1 and a bias circuit 11. An input terminal of the first inverter INV1 is configured to receive a target input signal IN, an output terminal of the first inverter INV1 is connected to the first node N1 and configured to output a first delayed signal, and the first inverter INV1 is connected to a power supply voltage Vcc (as illustrated in FIG. 2B) or is grounded (as illustrated in FIG. 2A) through the bias circuit 11. An output module 2 includes a second inverter INV2. An input terminal of the second inverter INV2 is connected to a second node N2, and an output terminal of the second inverter INV2 is configured to output a target output signal OUT. A delay control module 3 is connected to the first node N1 and the second node N2, and is configured to receive the first delayed signal and output a second delayed signal.

The bias circuit 11 is controlled by a bias control signal Sref and used as a switch. A turn-on degree of the bias circuit is affected by the bias control signal Sref, and the bias circuit is generally not fully turned on. The bias circuit 11 is configured to control a variation range of a current flowing through the first node N1 to be within a preset range based on a system Process Voltage Temperature (PVT) parameter. The system PVT parameter includes at least one of a manufacturing process, a supply voltage or an operating temperature of the delay circuit. The preset range is, for example, a small range close to zero, for example, 1%, 2%, 3%, so that the target output signal may be changed little when the at least one of the supply voltage, the operating temperature or the manufacturing process changes.

The bias circuit 11 is configured to control a charge transfer speed between the first inverter INV1 and the power supply voltage Vcc or between the first inverter INV1 and the ground terminal, to delay an output of the first inverter INV1. In the circuit illustrated in FIG. 2A, the bias circuit 11, which is not fully turned on, is disposed between the first inverter INV1 and the ground terminal, when the input signal IN is at a high level (i.e., logic 1), the first node N1 is slowly discharged to the ground through the bias circuit 11, and a signal drops to a low level (i.e., logic 0) after a period of time. In this situation, the bias circuit 11 delays an output of an inverted data of data 1 (i.e., a rising edge of the signal). Therefore, a rising edge delay is completed. In the circuit illustrated in FIG. 2B, the bias circuit 11, which is not fully turned on, is disposed between the first inverter INV1 and the power supply voltage Vcc, when the input signal IN is at a low level (i.e., logic 0), a signal level at the first node N1 is slowly raised by the power supply voltage Vcc through the bias circuit 11, and an output of the inverted data of data 0 (i.e., a falling edge of the signal) is delayed. Therefore, a falling edge delay is completed. A rising edge delay circuit, a falling edge delay circuit, or a rising edge and falling edge delay circuit (i.e., a delay of an entire pulse signal) can be realized by a separate arrangement or a combined arrangement of the circuit illustrated in FIG. 2A and the circuit illustrated in FIG. 2B.

Figure 3:
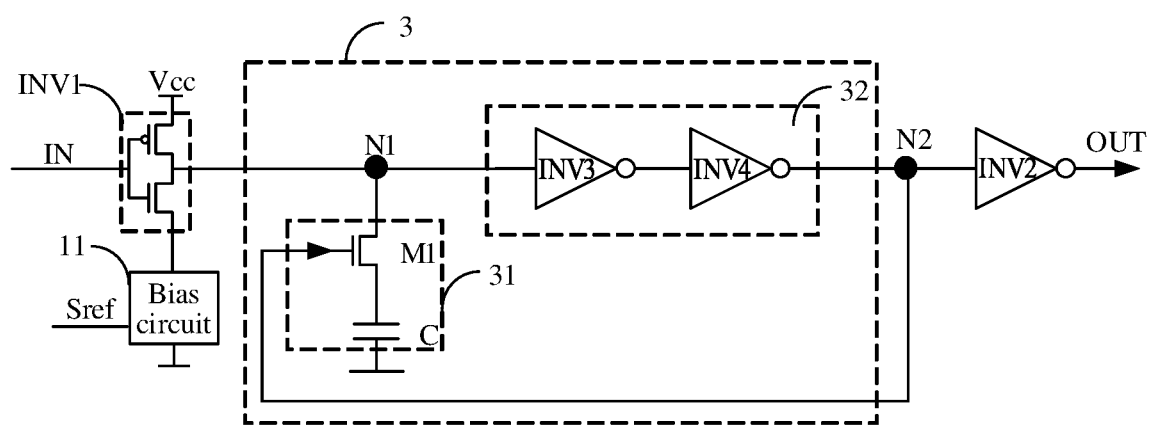
FIG. 3 is a schematic diagram of a delay control module 3 in a rising edge delay circuit according to an embodiment of the disclosure.
Figure 4:
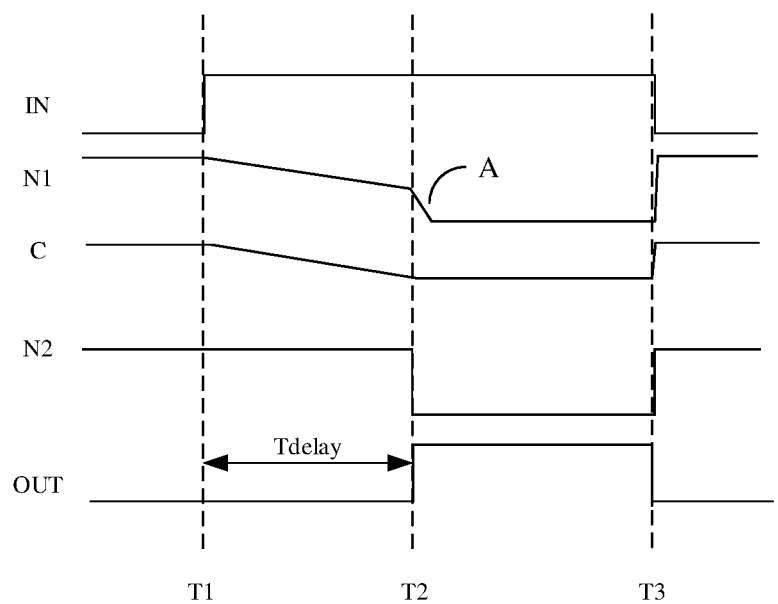
FIG. 4 is a timing diagram of the circuit illustrated in FIG. 3.

FIG. 3 is a schematic diagram of a delay control module 3 in a rising edge delay circuit according to an embodiment of the disclosure. FIG. 4 is a timing diagram of the circuit illustrated in FIG. 3. In the embodiment illustrated in FIG. 3, a target input signal to be delayed is a rising edge signal of a pulse signal.

With reference to FIG. 3, in an embodiment, a delay control module 3 includes a delay capacitor unit 31 and a buffer unit 32. The delay capacitor unit 31 is connected to a first node N1, one terminal of the buffer unit 32 is connected to the first node N1, and the other terminal of the buffer unit 32 is connected to a second node N2. The first node N1 outputs a first delayed signal and the second node N2 outputs a second delayed signal.

In the embodiment illustrated in FIG. 3, a first inverter INV1 in an input module 1 is grounded through a bias circuit 11. The delay capacitor unit 31 may include a first switch element M1 and a capacitor C. A first terminal of the first switch element M1 is connected to the first node N1, a second terminal of the first switch element is connected to a first terminal of the capacitor C, and a second terminal of the capacitor C is grounded. The buffer unit 32 includes a third inverter INV3 and a fourth inverter INV4 connected in series, and a control terminal of the first switch element M1 is connected to an output terminal of the fourth inverter INV4, i.e., the second node N2. When the target input signal is a rising edge signal, the first switch element M1 is an N-type transistor.

With reference to FIG. 4, before a first time T1, when the input signal IN is at a low level, a P-type transistor in the first inverter INV1 is turned on and an N-type transistor in the first inverter INV1 is turned off, and signals at the first node N1 and the second node N2 are both at a level of a power supply voltage Vcc. At this time, the N-type first switch element M1 is turned on, and the capacitor C is charged to the power supply voltage Vcc by the first node N1.

At the first time T1, when the input signal IN is changed from a low level to a high level, the P-type transistor in the first inverter INV1 is turned off and the N-type transistor in the first inverter INV1 is turned on, the first node N1 is discharged to the ground through the N-type transistor in the first inverter INV1 and the bias circuit 11 which is not fully turned on, and a level at the first node N1 drops. Before the level at the first node N1 drops to a level at which the signal at the second node N2 is inverted to a low level through the buffer unit 32, the first switch element M1 is turned on, and the first node N1 is charged by the fully charged capacitor C, to slow down a dropping speed of the level at the first node N1.

At a second time T2, when the signal level at the first node N1 drops to the level at which the signal of the second node N2 is inverted to a low level through the buffer unit 32, an output signal OUT is inverted from a low level to a high level. At this time, the N-type first switch element M1 is turned off, the capacitor C stops charging the first node N1 from the second time T2, and the first node N1 is only discharged to the ground through the bias circuit 11. During a stage A, the signal at the first node N1 rapidly drops to a zero level, the second node N2 is maintained at a zero level and the output signal OUT is maintained at a high level.

At a third time T3, the input signal IN is inverted from a high level to a low level (i.e., a falling edge of the pulse signal), the P-type transistor in the first inverter INV1 is turned on, the signals at the first node N1 and the second node N2 are rapidly inverted from a low level to a high level, and the output signal OUT is inverted to a low level. The first switch element M1 is turned on and the capacitor C is charged by the power supply voltage Vcc again through the first node N1.

In such way, a delay of a rising edge of the input signal IN is realized.

Figure 5:
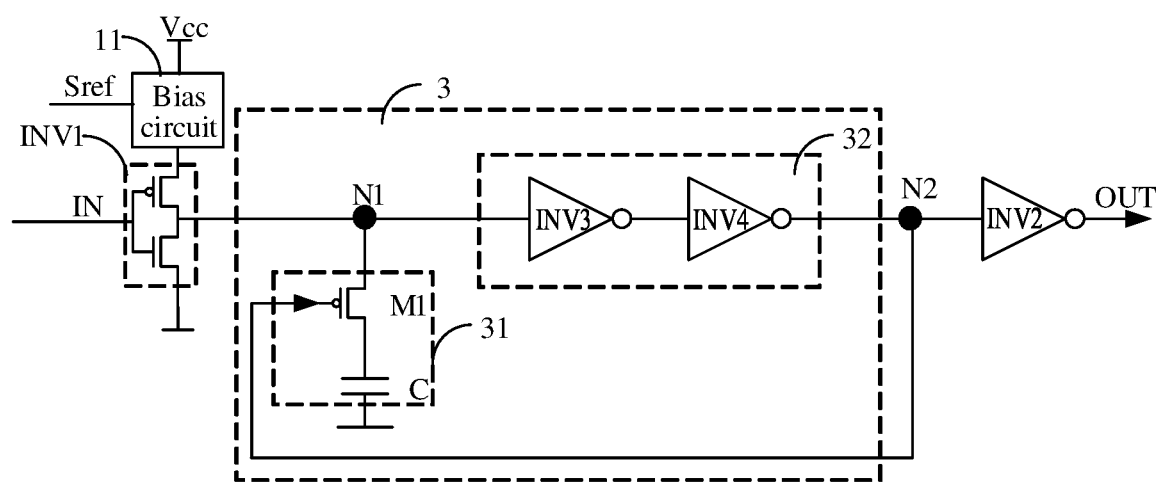
FIG. 5 is a schematic diagram of a delay control module 3 in a falling edge delay circuit according to an embodiment of the disclosure.
Figure 6:
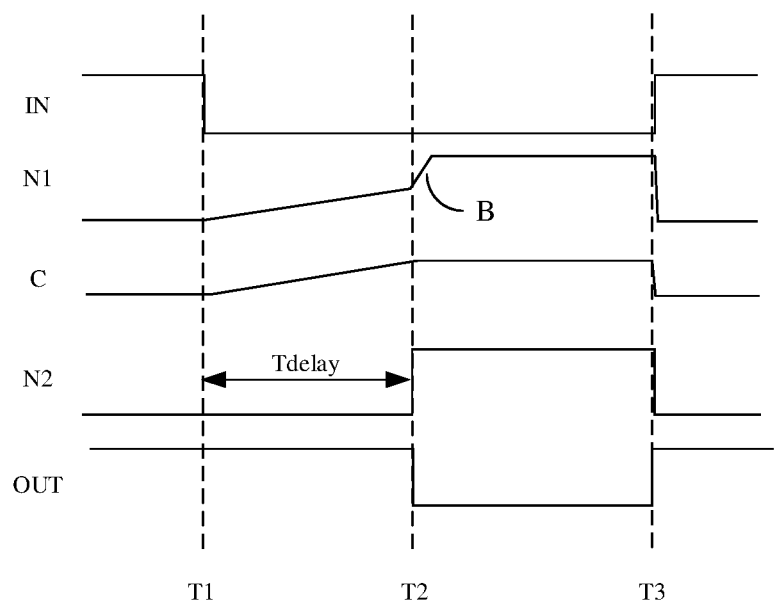
FIG. 6 is a timing diagram of the circuit illustrated in FIG. 5.

FIG. 5 is a schematic diagram of a delay control module 3 in a falling edge delay circuit according to an embodiment of the disclosure. FIG. 6 is a timing diagram of the circuit illustrated in FIG. 5. In the embodiment illustrated in FIG. 5, a target input signal to be delayed is a falling edge signal of a pulse signal.

With reference to FIG. 5, a structure of a delay control module 3 is similar to that in FIG. 3, and includes a delay capacitor unit 31 and a buffer unit 32. The delay capacitor unit 31 includes a first switch element M1 and a capacitor C. A first terminal of the first switch element M1 is connected to a first node N1, a second terminal of the first switch element is connected to a first terminal of the capacitor C, and a second terminal of the capacitor C is grounded. The buffer unit 32 includes a third inverter INV3 and a fourth inverter INV4 connected in series, and a control terminal of the first switch element M1 is connected to an output terminal of the fourth inverter INV4, i.e., a second node N2. When the target input signal is a falling edge signal, the first switch element M1 is a P-type transistor.

With reference to FIG. 6, before a first time T1, when an input signal IN is at a high level, a P-type transistor in a first inverter INV1 is turned off and an N-type transistor in the first inverter INV1 is turned on, and the first node N1 and the second node N2 are both at a zero level. At this time, the P-type first switch element M1 is turned on, and the capacitor C is discharged to the ground through the first node N1 and the N-type transistor in the first inverter INV1.

At the first time T1, when the input signal IN is changed from a high level to a low level, the P-type transistor in the first inverter INV1 is turned on and the N-type transistor in the first inverter INV1 is turned off, and the first node N1 is charged by a power supply voltage Vcc through the P-type transistor in the first inverter INV1 and a bias circuit 11 which is not fully turned on, and a level at the first node N1 rises. Before the level at the first node N1 rise to a level at which the signal at the second node N2 is inverted to a high level through the buffer unit 32, the P-type first switch element M1 remains on, the capacitor C is charged by the first node N1, and a rising speed of the level at the first node N1 is restrained.

At a second moment T2, the level at the first node N1 is raised to the level at which the signal at the second node N2 is inverted to a high level through the buffer unit 32. The P-type first switch element M1 is turned off, the first node N1 is only charged by the power supply voltage Vcc through the bias circuit 11, and the level at the first node N1 rapidly rises to the power supply voltage Vcc (stage B). An output signal OUT is maintained at a low level until the input signal IN is inverted to a high level again at a third time T3. At this time, the first switch element M1 is turned on, and the capacitor C is discharged to the ground again.

In FIG. 4 and FIG. 6, duration between the first time T1 and the second time T2 is referred to as a delay duration Tdelay, which is a rising edge delay duration in FIG. 4 and is a falling edge delay duration in FIG. 6. A duration of the delay duration Tdelay may be controlled by adjusting an element parameter of the bias circuit 11, an element parameter of the capacitor C, and by controlling the number of the delay capacitor units 31, which will be described in subsequent embodiments.

In an exemplary embodiment of the disclosure, the capacitor C may be implemented by one or more ordinary plate capacitors or transistor gate oxide capacitors, which is not limited in the disclosure.

Figure 7:
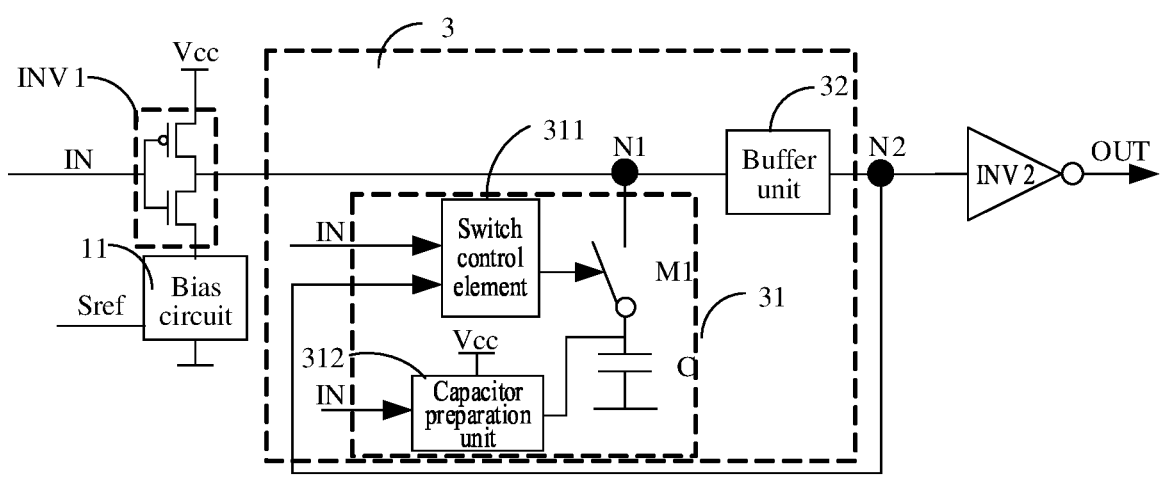
FIG. 7 is a schematic diagram of a delay control module 3 in a rising edge delay circuit according to another embodiment of the disclosure.

FIG. 7 is a schematic diagram of a delay control module 3 in a rising edge delay circuit according to another embodiment of the disclosure.

With reference to FIG. 7, in an embodiment, a delay control module 3 includes a delay capacitor unit 31 and a buffer unit 32. The delay capacitor unit 31 may include a first switch element M1, a switch control element 311, a capacitor C and a capacitor preparation unit 312. Input terminals of the switch control element 311 are connected to an input terminal of an input module 1 and a second node N2, respectively. A first terminal of the capacitor preparation unit 312 is connected to a first terminal of the capacitor C, a second terminal of the capacitor preparation unit 312 is connected to a power supply voltage Vcc, and a control terminal of the capacitor preparation unit 312 is connected to the input terminal of the input module 1. The capacitor preparation unit 312 is configured to charge the capacitor C before a target input signal reaches the input terminal of the input module 1, and stop charging the capacitor C after the target input signal reaches the input terminal of the input module 1.

Still with reference to FIG. 4, before the first time T1, when the input signal IN is at a low level, the capacitor preparation unit 312 is turned on, and the capacitor C is charged by the power supply voltage Vcc through the capacitor preparation unit 312. The switch control element 311 controls the first switch element M1 to turn off, a first node N1 is at a high level, the second node N2 is at a high level, and an output signal OUT is at a low level.

At the first time T1, when the input signal IN changes from a low level to a high level (i.e., a rising edge of a pulse signal), that is, when the target input signal reaches the input terminal of the input module 1, an N-type transistor in a first inverter INV1 is turned on, a signal at the first node N1 is discharged to the ground through a bias circuit 11, and the signal at the first node N1 drops from a high level to a low level. Before the second time T2, the signal at the first node N1 has not dropped to a level at which the signal at the second node N2 is inverted through the buffer unit 32, and the second node N2 is still at a high level. At this time, the switch control element 311 controls the first switch element M1 to close, the first node N1 is charged by the capacitor C, while the first node N1 is discharged through the bias circuit 11, and the signal level at the first node N1 drops slowly.

At the second time T2, when the signal at the first node N1 drops to the level at which the signal of the second node N2 is inverted to a low level through the buffer unit 32, the output signal OUT is inverted from a low level to a high level. At this time, the switch control element 311 controls the first switch element M1 to turn off, the capacitor C stops charging the first node N1 from the second time T2, and the first node N1 is discharged only through the bias circuit 11. The signal at the first node N1 rapidly drops to a zero level (stage A), the second node N2 is maintained at a zero level and the output signal OUT is maintained at a high level.

At the third time T3, the input signal IN is inverted from a high level to a low level (i.e., a falling edge of the pulse signal), a P-type transistor in the first inverter INV1 is turned on, the first node N1 is rapidly inverted from a low level to a high level, the capacitor preparation unit 312 is turned on, and the switch control element 311 controls the first switch element M1 to turn off. The capacitor C is charged by the power supply voltage Vcc through the capacitor preparation unit 312. A first terminal of the capacitor C, i.e., the first node N1, is at a high level, the second node N2 is at a high level, and the output signal OUT is at a low level.

In such way, a delay of a rising edge of the input signal IN is realized.

Figure 8:
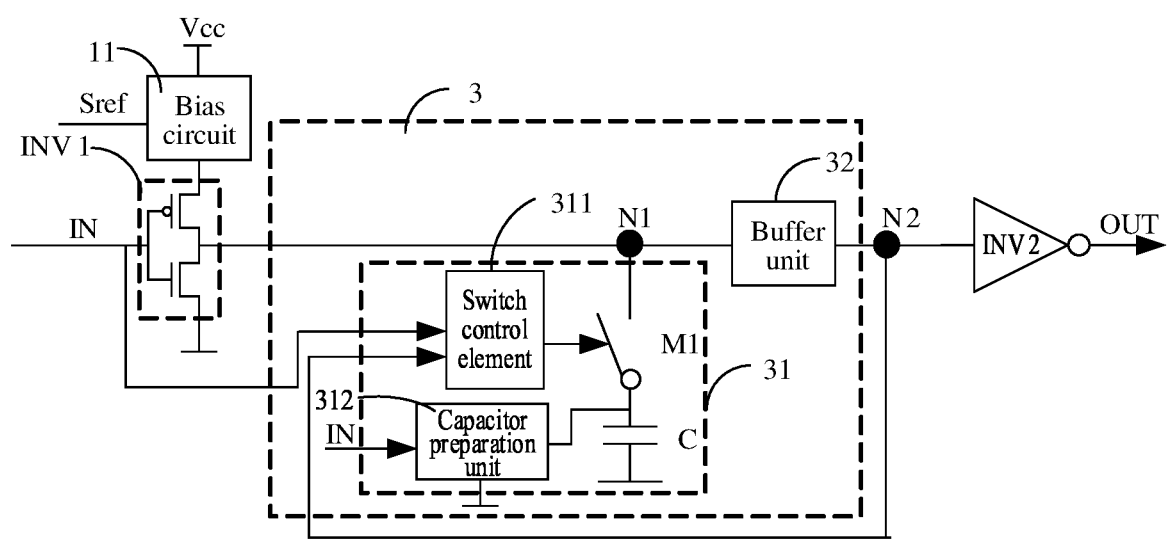
FIG. 8 is a schematic diagram of a delay control module 3 in a falling edge delay circuit according to another embodiment of the disclosure.

FIG. 8 is a schematic diagram of a delay control module 3 in a falling edge delay circuit according to another embodiment of the disclosure.

In FIG. 8, a first inverter INV1 in an input module 1 is connected to a power supply voltage Vcc through a bias circuit 11. A delay capacitor unit 31 may include a first switch element M1, a switch control element 311, a capacitor C and a capacitor preparation unit 312. A first terminal of the first switch element M1 is connected to a first node N1, a second terminal of the first switch element M1 is connected to a first terminal of the capacitor C, and a control terminal of the first switch element M1 is connected to an output terminal of the switch control element 311. Input terminals of the switch control element 311 are connected to an input terminal of the input module 1 and a second node N2, respectively, and a second terminal of the capacitor C is grounded. A first terminal of the capacitor preparation unit 312 is connected to the first terminal of the capacitor C, a second terminal of the capacitor preparation unit 312 is grounded, and a control terminal of the capacitor preparation unit 312 is connected to the input terminal of the input module 1.

The capacitor preparation unit 312 is configured to discharge the capacitor C before a target input signal reaches the input terminal of the input module 1, and stop discharging the capacitor C after the target input signal reaches the input terminal of the input module 1.

Still with reference to FIG. 6, before the first time T1, when an input signal IN is at a high level, the capacitor preparation unit 312 is turned on, and the capacitor C is discharged to the ground. The switch control element 311 controls the first switch element M1 to turn off, the first terminal of the capacitor C, i.e., the first node N1, is at a low level, the second node N2 is also at a low level, and an output signal OUT is at a high level.

At the first time T1, when the input signal IN changes from a high level to a low level (i.e., a falling edge of a pulse signal), that is, when the target input signal reaches the input terminal of the input module 1, a P-type transistor in the first inverter INV1 is turned on, the first node N1 is charged by the power supply voltage Vcc through the bias circuit 11 and the P-type transistor in the first inverter INV1, and a signal level at the first node N1 rises from a zero level to the power supply voltage Vcc. Before the second time T2, the signal level at the first node N1 has not raised to a level at which a level at the second node N2 is inverted through a buffer unit 32. Even if an N-type transistor in the buffer unit 32 is turned on or a P-type transistor in the buffer unit is turned off, the signal level at the second node N2 is not yet equal to the signal level at the first node N1, and the signal at the second node N2 is still at a low level. At this time, the switch control element 311 controls the first switch element M1 to close, the first node N1 is charged by the power supply voltage Vcc through the bias circuit 11, the capacitor C is charged by the first node N1, and the signal level at the first node N1 slowly rises.

At the second time T2, when the signal at the first node N1 rises to the level at which the signal of the second node N2 is inverted to a high level through the buffer unit 32, the output signal OUT is inverted from a high level to a low level, i.e., a target output signal is output by an output module 2. At this time, the switch control element 311 controls the first switch element M1 to turn off, the first node N1 is only charged by the power supply voltage Vcc, the signal level at the first node N1 rapidly rises to the power supply voltage Vcc, and the output signal OUT is maintained at a low level.

At the third time T3, the input signal IN is inverted from a low level to a high level (i.e., a rising edge of the pulse signal), the N-type transistor in the first inverter INV1 is turned on, the first node N1 is rapidly inverted from a high level to a low level, the capacitor preparation unit 312 is turned on, and the capacitor C is discharged to the ground to a zero level. The second node N2 is at a low level, and the output signal OUT is at a high level.

In such way, a delay of the falling edge of the input signal IN is realized.

Figure 9:
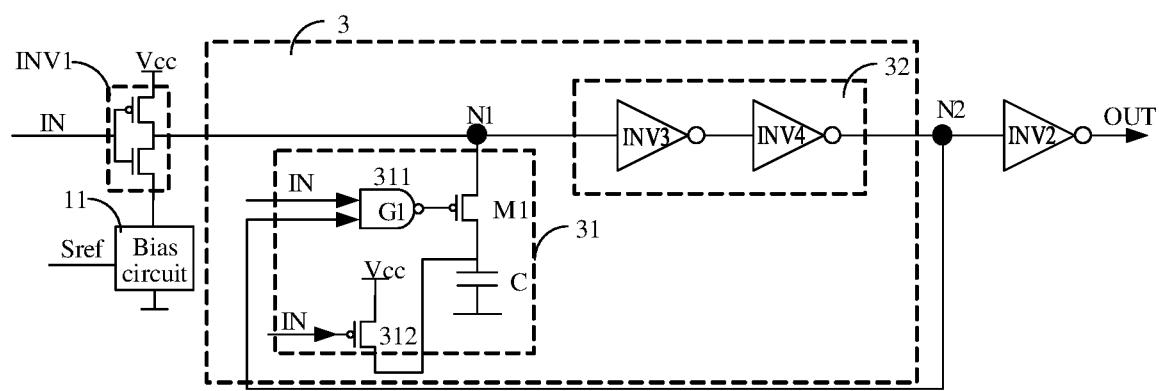
FIG. 9 is a specific circuit diagram of the circuit illustrated in FIG. 7 according to an embodiment of the disclosure.

FIG. 9 is a specific circuit diagram of the circuit illustrated in FIG. 7 according to an embodiment of the disclosure.

With reference to FIG. 9, in an embodiment, a first switch element M1 may be a P-type transistor, a switch control element 311 may be an NAND gate G1, and a capacitor preparation unit 312 may be implemented by a P-type transistor. The buffer unit 32 may include a third inverter INV3 and a fourth inverter INV4 connected in series, and one input terminal of the switch control element 311 is connected to an output terminal of the fourth inverter INV4, i.e. the second node N2.

When an input signal IN is at a low level, a P-type transistor in a first inverter INV1 is turned on, an N-type transistor in the first inverter INV1 is turned off, a level at a first node N1 is equal to a power supply voltage Vcc, and a level at the second node N2 is equal to the power supply voltage Vcc. Two input terminals of the NAND gate G1 are at a low level and a high level, respectively, and the NAND gate G1 outputs a high level to control the P-type first switch element M1 to turn off. At this time, a P-type transistor of the capacitor preparation unit 312 is turned on due to the input signal IN being at a low level, an upper plate of the capacitor C is connected to the power supply voltage Vcc, and the capacitor C is charged.

When the input signal IN is changed from a low level to a high level, the N-type transistor in the first inverter INV1 is turned on and the P-type transistor in the first inverter INV1 is turned off, and the first node N1 is discharged to the ground through the N-type transistor in the first inverter INV1 and a bias circuit 11, and the level at the first node N1 drops. When the level at the first node N1 has not dropped to a level at which the level at the second node N2 is inverted to a low level through the buffer unit 32, the two input terminals of the NAND gate G1 are both at a high level, and the NAND gate G1 outputs a low level to control the P-type first switch element M1 to turn on, and the first node N1 is started to be charged by the fully charged capacitor C. On one hand, the first node N1 is discharged to the ground through the bias circuit 11, and on the other hand, the first node N1 is charged by the capacitor C, so that the level drops slowly.

When the level at the first node N1 drops to the level at which the level at the second node N2 is inverted to a low level through the buffer unit 32, one input terminal of the NAND gate G1 is at a high level, the other input terminal of the NAND gate G1 is at a low level, and the NAND gate G1 outputs a high level to control the P-type first switch element M1 to turn off. The first node N1 is discharged to the ground only through the bias circuit 11, and the level drops rapidly, so that the output signal OUT is maintained at a high level until the input signal is inverted to a low level again.

Figure 10:
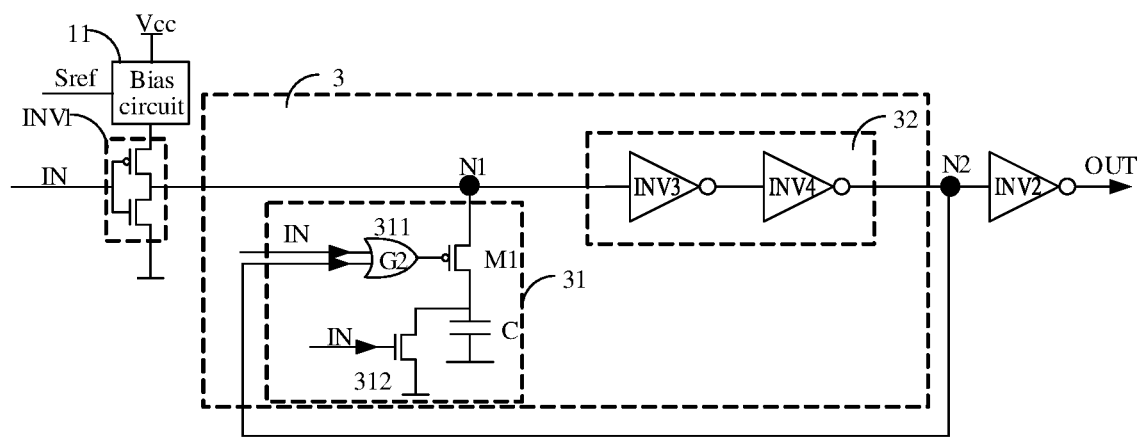
FIG. 10 is a specific circuit diagram of the circuit illustrated in FIG. 8 according to an embodiment of the disclosure.

FIG. 10 is a specific circuit diagram of the circuit illustrated in FIG. 8 according to an embodiment of the disclosure.

With reference to FIG. 10, in an embodiment, a first switch element M1 may be a P-type transistor, a switch control element 311 may be an OR gate G2, and a capacitor preparation unit 312 may be implemented by an N-type transistor. A buffer unit 32 may include a third inverter INV3 and a fourth inverter INV4 connected in series, and one input terminal of the switch control element 311 is connected to an output terminal of the fourth inverter INV4, i.e. a second node N2.

When an input signal IN is at a high level, a P-type transistor in a first inverter INV1 is turned off, an N-type transistor in the first inverter INV1 is turned on, a first node N1 is discharged to the ground through the N-type transistor in the first inverter INV1, and a second node N2 is at a low level. One input terminal of the OR gate G2 is at a high level, the other input terminal of the OR gate G2 is at a low level, and the OR gate G2 outputs a high level to control the P-type first switch element M1 to turn off. At this time, an N-type transistor of the capacitor preparation unit 312 is turned on due to the input signal IN being at a high level, an upper plate of a capacitor C is grounded, and the capacitor C is discharged to a zero level.

When the input signal IN is changed from a high level to a low level, the N-type transistor in the first inverter INV1 is turned off and the P-type transistor in the first inverter INV1 is turned on, the first node N1 is charged by a power supply voltage Vcc through the P-type transistor in the first inverter INV1 and a bias circuit 11 which is not fully turned on, and a level at the first node N1 rises. When the level at the first node N1 has not raised to a level at which a level at the second node N2 is inverted to a high level through the buffer unit 32, the input terminals of the OR gate G2 are both at a low level, and the OR gate G2 outputs a low level to control the P-type first switch element M1 to turn on, and the discharged capacitor C is started to be charged by the first node N1. On one hand, the first node N1 is charged by the power supply voltage Vcc through the bias circuit 11, and on the other hand, the first node N1 charges the capacitor C, so that the level at the first node rises slowly.

When the level at the first node N1 rises to the level at which the level at the second node N2 is inverted to a high level through the buffer unit 32, one input terminal of the OR gate G2 is at a low level (IN), the other input terminal of the OR gate G2 is at a high level (N2), and the OR gate G2 outputs a high level to control the P-type first switch element M1 to turn off. The first node N1 is only charged, and the level rises rapidly, so that an output signal OUT is maintained at a low level until the input signal is inverted to a high level again.

In other embodiments, the first switch element M1 and the switch control element 311 may also be implemented in other ways, and those skilled in the art may configure the logic circuit by themselves according to circuit functions.

In embodiments of the disclosure, the delay control module 3 may be configured with a plurality of delay capacitor units 31 connected in parallel, to realize flexible control of the delay duration Tdelay. In this situation, the input terminal of the switch control element 311 may be configured to receive a capacitor enable signal, and the capacitor enable signal is configured to control the delay capacitor units 31 to connect to or disconnect from the first node N1. Some of the delay capacitor units may be controlled to disconnect from the first node N1 (the delay capacitor unit does not vary with the input signal) to reduce the delay duration, or some of the delay capacitor units may be controlled to connect to the first node N1 (the delay capacitor unit varies with the input signal) to increase the delay duration. This kind of control can also be referred to as control of the delay capacitor unit 31 to be enabled or disabled.

Figure 11:
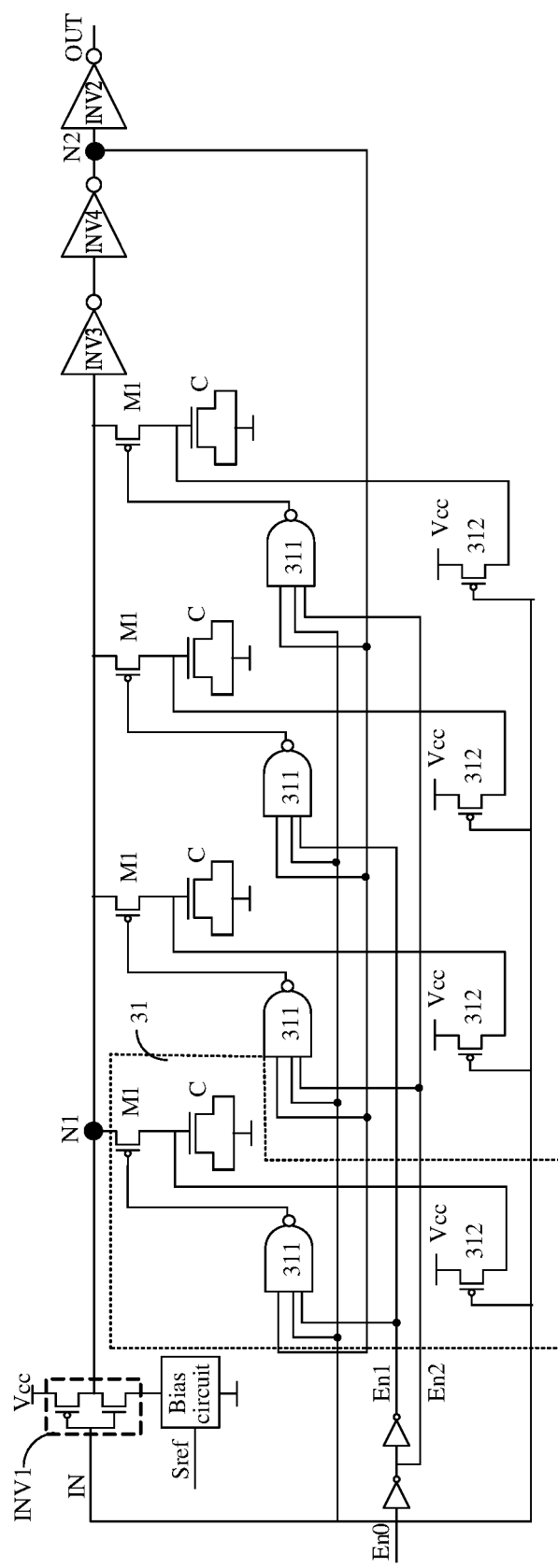
FIG. 11 is a schematic diagram illustrating a connection of a capacitor enable signal according to an embodiment of the disclosure.

FIG. 11 is a schematic diagram illustrating a connection of a capacitor enable signal according to an embodiment of the disclosure.

With reference to FIG. 11, in an embodiment, a first number (for example, 2 in the FIG. 11) of delay capacitors units in a plurality of delay capacitor units 31 are configured to receive a first capacitor enable signal En1, a second number (for example, 2 in the FIG. 11) of delay capacitor units in the plurality of delay capacitor units 31 are configured to receive a second capacitor enable signal En2, and the first capacitor enable signal En1 and the second capacitor enable signal En2 are inverted signals. That is, at most four delay capacitor units 31 may be connected to the first node N1, but only two delay capacitor units 31 may be configured to delay the target input signal at the same time under the control of the first capacitor enable signal En1 and the second capacitor enable signal En2.

As illustrated in FIG. 11, the first capacitor enable signal En1 and the second capacitor enable signal En2 may be implemented by inverting a capacitor enable signal En0 through inverter(s).

In addition to controlling the number of the delay capacitor units 31 to configure the delay duration, the delay duration may also be configured by controlling equivalent capacitance values in the delay capacitor units 31. For example, equivalent capacitance values of the plurality of delay capacitor units are configured in arithmetic progression or geometric progression, respectively.

Figure 12:
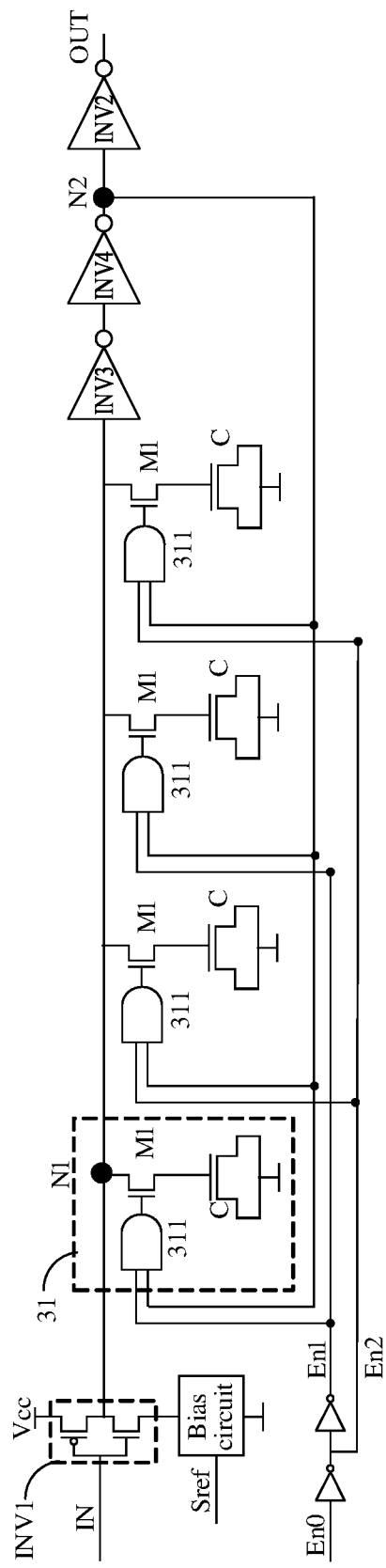
FIG. 12 is a schematic diagram illustrating a connection of a capacitor enable signal according to another embodiment of the disclosure.

FIG. 12 is a schematic diagram illustrating a connection of a capacitor enable signal according to another embodiment of the disclosure.

With reference to FIG. 12, in an embodiment, a delay capacitor unit 31 may include a first switch element M1, a capacitor C and a switch control element 311. An output terminal of the switch control element 311 is connected to a control terminal of the first switch element M1, and two input terminals of the switch control element are connected to a second node N2 and a first capacitor enable signal En1, respectively, or connected to the second node N2 and a second capacitor enable signal En2, respectively.

In this situation, in a rising edge delay circuit, when the first switch element M1 is implemented by an N-type transistor, the switch control element 311 may be an AND gate, and an enable value of the capacitor enable signal is a high level. Therefore, when the capacitor enable signal is at a low level, the switch control element 311 outputs a low level and the N-type first switch element M1 is turned off. When the capacitor enable signal is at a high level and the second node N2 is at a low level, the switch control element 311 outputs a low level and the N-type first switch element M1 is turned off. When both the second node N2 and the capacitor enable signal are at a high level, the switch control element 311 outputs a high level to control the N-type first switch element M1 to turn on.

When the first switch element M1 is implemented by a P-type transistor, the switch control element 311 may be an NAND gate, and the enable value of the capacitor enable signal is a high level. Therefore, when the capacitor enable signal is at a low level, the switch control element 311 outputs a high level and the P-type first switch element M1 is turned off. When the capacitor enable signal is at a high level and the second node N2 is at a low level, the switch control element 311 outputs a high level and the P-type first switch element M1 is turned off. When both the second node N2 and the capacitor enable signal are at a high level, the switch control element 311 outputs a low level to control the P-type first switch element M1 to turn on.

Connection manners of the capacitor enable signals in FIG. 11 and FIG. 12 may vary according to selectable amount of delay duration. The circuits in the embodiments of the disclosure are only examples and in practical, control logic may be implemented by a variety of digital circuits and the present disclosure is not limited thereto.

In addition to controlling the delay duration according to the delay capacitor unit 31, it is also possible to affect a signal change speed of the first node N1 through the bias circuit 11, so as to fine-tune the delay duration.

Figure 13A:
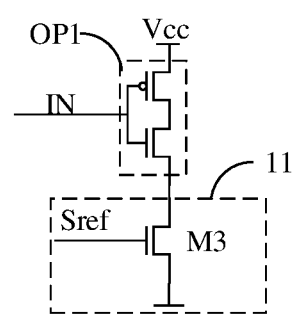
FIG. 13A is a schematic diagram of a bias circuit 11 in a rising edge delay circuit according to an embodiment of the disclosure.
Figure 13B:
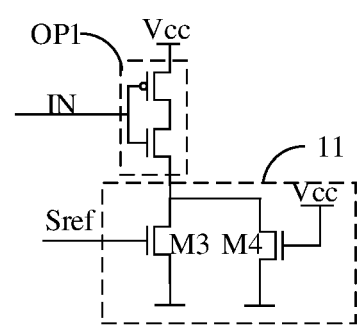
FIG. 13B is a schematic diagram of a bias circuit 11 in a rising edge delay circuit according to another embodiment of the disclosure.
Figure 13C:
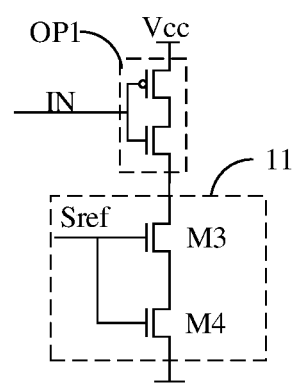
FIG. 13C is a schematic diagram of a bias circuit 11 in a rising edge delay circuit according to yet another embodiment of the disclosure.

FIGS. 13A to 13C are schematic diagrams of a bias circuit 11 in a rising edge delay circuit according to three embodiments of the disclosure.

With reference to FIG. 13A, in an embodiment, a bias circuit 11 includes a third switch element M3. A first terminal of the third switch element M3 is connected to a first inverter INV1, a second terminal of the third switch element M3 is connected to a power supply voltage Vcc or is grounded, and a control terminal of the third switch element M3 is connected to a bias control signal Sref.

The bias control signal Sref is affected by PVT of the circuit. A turn-on degree of the bias circuit 11 may be automatically adjusted by the bias control signal Sref according to the PVT condition of the circuit, and a variation range of a charging or discharging current flowing through the first node may be controlled to be within a preset range based on the PVT parameter.

With reference to FIG. 13B, in another embodiment, a bias circuit 11 may include a third switch element M3 and a fourth switch element M4. Connection manners of first and second terminals of the fourth switch element M4 are the same as that of first and second terminals of the third switch element, and a control terminal of the fourth switch element M4 is electrically connected to a power supply voltage Vcc.

A turn-on degree of the fourth switch element M4 is affected by the power supply voltage Vcc. With reference to FIG. 11 and FIG. 13B, when the power supply voltage Vcc rises, the turn-on degree of the third switch element M3 remains substantially unchanged under the control of the bias control signal Sref, and the turn-on degree of the fourth switch element M4 is increased under the control of the power supply voltage Vcc. The current flowing through the third switch element M3 remains substantially unchanged or a variation range of the current is within a preset range, and the current flowing through the fourth switch element M4 increases. Further, a discharging current flowing through the first inverter INV1 increases. However, since the power supply voltage Vcc increases, the delay capacitor unit 31 stores more charges (or an initial value of the discharging voltage is higher), and the delay duration formed by the first inverter INV1 and the delay capacitor unit 31 remains substantially unchanged or a variation range of the delay duration is within a preset range.

In the circuits illustrated in FIGS. 13A and 13B, the bias circuit 11 is used in a rising edge delay circuit, and the third switch element M3 and the fourth switch element M4 are both N-type transistors. The first terminal of the third switch element M3 and the first terminal of the fourth switch element M4 are both connected to a source of an N-type transistor in the first inverter INV1, the second terminal of the third switch element M3 and the second terminal of the fourth switch element M4 are both grounded, and the control terminal of the fourth switch element M4 is directly connected to the power supply voltage Vcc.

With reference to FIG. 13C, in yet another embodiment, a bias circuit 11 may also be realized by a third switch element M3 and a fourth switch element M4 connected in series. Control terminals of the third switch element M3 and the fourth switch element M4 are both configured to receive a bias control signal Sref.

Figure 14:
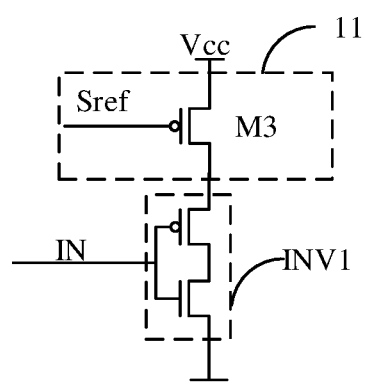
FIG. 14 is a schematic diagram of a bias circuit 11 in a falling edge delay circuit according to an embodiment of the disclosure.

FIG. 14 is a schematic diagram of a bias circuit 11 in a falling edge delay circuit in an embodiment of the disclosure.

With reference to FIG. 14, when a bias circuit 11 is used in a falling edge delay circuit, the bias circuit 11 is connected between a first inverter INV1 and a power supply voltage Vcc, and a third switch element M3 implemented by a P-type transistor forms the bias circuit 11.

Figure 15:
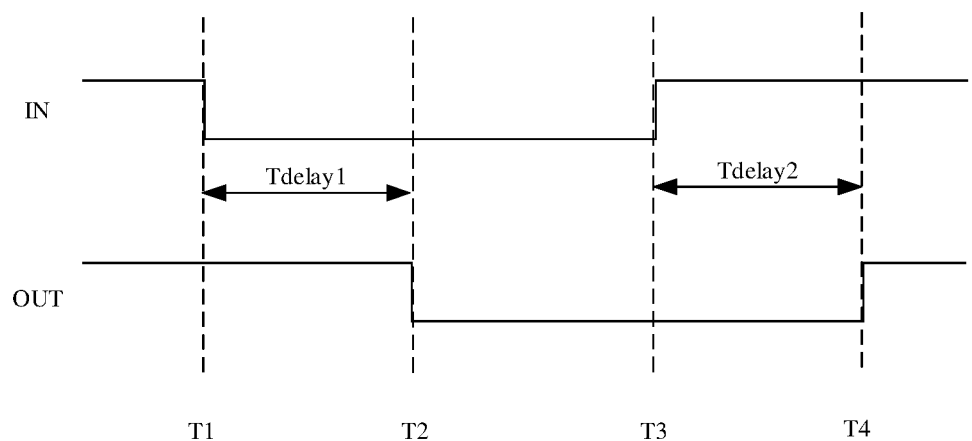
FIG. 15 is a schematic diagram illustrating a delay performance of a delay circuit according to an embodiment of the disclosure.

FIG. 15 is a schematic diagram of a delay performance of a delay circuit according to another embodiment of the disclosure.

With reference to FIG. 15, the delay circuit in the disclosure may not only be applied to a rising edge delay circuit (i.e., there is a preset delay between a rising edge of a target signal and a rising edge of an input signal, and there is almost no delay between a falling edge of the target signal and a falling edge of the input signal, as illustrated in FIG. 4), a falling edge delay circuit (i.e., there is a preset delay between the falling edge of the target signal and the falling edge of the input signal, and there is almost no delay between the rising edge of the target signal and the rising edge of the input signal, as illustrated in FIG. 6), but also may be applied to a circuit for delaying both a rising edge and a falling edge (i.e., there is a preset delay between the rising edge of the target signal and the rising edge of the input signal, and there is a preset delay between the falling edge of the target signal and the falling edge of the input signal), to realize the delay waveform illustrated in FIG. 15. In FIG. 15, duration between a first time T1 and a second time T2 is a first delay duration Tdelay1 of a falling edge, and duration between a third time T3 and a fourth time T4 is a second delay duration Tdelay2 of a rising edge. These two delay durations may be equal or different. Specific logic circuit may be constructed by the person skilled in the art in accordance with the principles of the above embodiments, which is not particularly limited in the disclosure.

Further, it should be noted that the modules or units in the delay circuit according to the embodiments of the disclosure, for example, the input module, the output module, the delay control module and the delay capacitor unit, can be implemented by hardware such as circuits.

The delay circuit provided by the embodiments of the disclosure can reduce the power consumption while improving the state restoration speed.

It should be noted that, although several modules or units of the device for performing actions are mentioned in the above detailed description, this division is not mandatory. Indeed, according to embodiments of the disclosure, features and functions of two or more modules or units described above may be embodied in one module or unit. Conversely, features and functions of one module or unit described above may be further divided and embodied by multiple modules or units.

Other embodiments of the disclosure will readily occur to those skilled in the art upon consideration of the specification and practice of the disclosure herein. This application is intended to cover any variations, uses or adaptations of the present disclosure that follow the general principles of the disclosure and include common general knowledge or customary technical means in the art not disclosed herein. The specification and embodiments are to be regarded as exemplary only, and the true scope and conception of the disclosure are pointed out by the claims.

What is claimed is:

1. A delay circuit, comprising:
    an input module, configured to receive a target input signal and output the target input signal to a first node, the target input signal being a rising edge signal or a falling edge signal of a pulse signal;
    an output module, configured to output a target output signal, the target output signal being a delayed signal of the target input signal;
    a delay control module, connected to the input module through the first node, and connected to the output module through a second node, the delay control module comprising at least one delay capacitor unit, and the delay control module being configured to control the at least one delay capacitor unit to connect to the first node within a rising edge delay duration or a falling edge delay duration, and control the at least one delay capacitor unit to disconnect from the first node outside the rising edge delay duration or the falling edge delay duration;
    wherein the rising edge delay duration is a delay duration between a rising edge of the target output signal and a rising edge of the target input signal, and the falling edge delay duration is a delay duration between a falling edge of the target output signal and a falling edge of the target input signal.

2. The delay circuit of claim 1, wherein the input module comprises a first inverter and a bias circuit;
    an input terminal of the first inverter is configured to receive the target input signal, an output terminal of the first inverter is connected to the first node and configured to output a first delayed signal, and the first inverter is connected to a power supply voltage or is grounded through the bias circuit; and
    the bias circuit is configured to control a variation range of a current flowing through the first node to be within a preset range based on a system Process Voltage Temperature (PVT) parameter, the system PVT parameter comprises at least one of a manufacturing process, a supply voltage or an operating temperature of the delay circuit.

3. The delay circuit of claim 2, wherein the bias circuit comprises a third switch element, a first terminal of the third switch element is electrically connected to the first inverter, a second terminal of the third switch element is connected to the power supply voltage or is grounded, and a control terminal of the third switch element is configured to receive a bias control signal.

4. The delay circuit of claim 3, wherein the bias circuit further comprises a fourth switch element, and the fourth switch element is connected in parallel with the third switch element.

5. The delay circuit of claim 4, wherein the third switch element and the fourth switch element are both N-type transistors, the first terminal of the third switch element and a first terminal of the four switch element are connected to a source of an N-type transistor in the first inverter, the second terminal of the third switch element and a second terminal of the fourth switch element are grounded, and a control terminal of the fourth switch element is connected to the power supply voltage.

6. The delay circuit of claim 3, wherein the third switch element is a P-type transistor, the first terminal of the third switch element is connected to a drain of a P-type transistor in the first inverter, and the second terminal of the third switch element is connected to the power supply voltage.

7. The delay circuit of claim 1, wherein the output module comprises a second inverter, an input terminal of the second inverter is connected to the second node, and an output terminal of the second inverter is configured to output the target output signal.

8. The delay circuit of claim 1, wherein the delay control module further comprises a buffer unit, one terminal of the buffer unit is connected to the first node and is configured to receive a first delayed signal, and the other terminal of the buffer unit is connected to the second node and is configured to output a second delayed signal.

9. The delay circuit of claim 8, wherein the buffer unit comprises a third inverter and a fourth inverter, an input terminal of the third inverter is connected to the first node, an output terminal of the third inverter is connected to an input terminal of the fourth inverter, and an output terminal of the fourth inverter is connected to the second node.

10. The delay circuit of claim 8, wherein a first terminal of the at least one delay capacitor unit is connected to the first node, and a second terminal of the at least one delay capacitor unit is grounded; and
wherein the at least one delay capacitor unit comprises a first switch element and a capacitor, a first terminal of the first switch element is connected to the first node, a second terminal of the first switch element is connected to a first terminal of the capacitor, a control terminal of the first switch element is electrically connected to the second node, and a second terminal of the capacitor is grounded.

11. The delay circuit of claim 10, wherein
when the target input signal is a rising edge signal, the first switch element is an N-type transistor; or
when the target input signal is a falling edge signal, the first switch element is a P-type transistor.

12. The delay circuit of claim 10, wherein the at least one delay capacitor unit further comprises a switch control element, an output terminal of the switch control element is connected to the control terminal of the first switch element, and an input terminal of the switch control element is configured to receive the target input signal and the second delayed signal.

13. The delay circuit of claim 12, wherein the at least one delay capacitor unit further comprises a capacitor preparation unit, a first terminal of the capacitor preparation unit is connected to the first terminal of the capacitor, a second terminal of the capacitor preparation unit is connected to a power supply voltage or is grounded, and a control terminal of the capacitor preparation unit is configured to receive the target input signal.

14. The delay circuit of claim 13, wherein when the target input signal is a rising edge signal, the second terminal of the capacitor preparation unit is connected to the power supply voltage, and the capacitor preparation unit is configured to charge the capacitor before a first time and stop charging the capacitor after the first time, the first time being a time when the target input signal reaches an input terminal of the input module.

15. The delay circuit of claim 14, wherein the capacitor preparation unit comprises a second switch element, the second switch element is a P-type transistor, a first terminal of the second switch element is connected to the power supply voltage, a second terminal of the second switch element is connected to the first terminal of the capacitor, and a control terminal of the second switch element is configured to receive the target input signal.

16. The delay circuit of claim 13, wherein when the target input signal is a falling edge signal, the second terminal of the capacitor preparation unit is grounded, and the capacitor preparation unit is configured to discharge the capacitor before a second time and stop discharging the capacitor after the second time, the second time being a time when the target input signal reaches an input terminal of the input module.

17. The delay circuit of claim 16, wherein the capacitor preparation unit comprises a second switch element, the second switch element is an N-type transistor, a first terminal of the second switch element is grounded, a second terminal of the second switch element is connected to the first terminal of the capacitor, and a control terminal of the second switch element is configured to receive the target input signal.

18. The delay circuit of claim 12, wherein the first switch element is a P-type transistor, and the switch control element is an NAND gate or an OR gate.

19. The delay circuit of claim 12, wherein the input terminal of the switch control element is further configured to receive a capacitor enable signal, and the capacitor enable signal is configured to control the at least one delay capacitor unit to connect to or disconnect from the first node.

20. The delay circuit of claim 19, wherein the delay control module comprises a plurality of delay capacitor units connected in parallel, a first number of delay capacitors units in the plurality of delay capacitor units are configured to receive a first capacitor enable signal, a second number of delay capacitor units in the plurality of delay capacitor units are configured to receive a second capacitor enable signal, and the first capacitor enable signal and the second capacitor enable signal are inverted signals.

* * * * *